US008678534B2

(12) United States Patent
Rozenstein et al.

(10) Patent No.: US 8,678,534 B2
(45) Date of Patent: Mar. 25, 2014

(54) MULTIPLE ITERATION SUBSTRATE PRINTING

(75) Inventors: Noam Rozenstein, Afula (IL); Avi Levy, Mitzpe Aviv (IL); Michael Litvin, Rishon Le Zion (IL); Yaron Mazor, Ramat Yishay (IL); Einat Cohen, Givatayim (IL); Muhammad Iraqui, Tira (IL)

(73) Assignee: Camtek Ltd., Migdal Haemek, IL (US)

( * ) Notice: Subject to any disclaimer, the term of this patent is extended or adjusted under 35 U.S.C. 154(b) by 148 days.

(21) Appl. No.: 13/313,121

(22) Filed: Dec. 7, 2011

(65) Prior Publication Data

US 2012/0162298 A1 Jun. 28, 2012

Related U.S. Application Data

(60) Provisional application No. 61/425,779, filed on Dec. 22, 2010.

(51) Int. Cl.
*B41J 29/38* (2006.01)

(52) U.S. Cl.
USPC .................................. 347/14; 347/9; 347/40

(58) Field of Classification Search
USPC ......... 347/5, 9, 12–14, 18, 19, 102, 6, 40–43; 118/697; 427/97.4
IPC ........................................................ B41J 29/38
See application file for complete search history.

(56) References Cited

U.S. PATENT DOCUMENTS

| | | | | |
|---|---|---|---|---|
| 5,992,962 A * | 11/1999 | Yen et al. | ........................... | 347/9 |
| 6,588,892 B1 * | 7/2003 | Stramel et al. | ................ | 347/102 |
| 6,754,551 B1 * | 6/2004 | Zohar et al. | ................... | 700/121 |
| 2002/0130931 A1 * | 9/2002 | Hawkins et al. | ................ | 347/74 |
| 2002/0171699 A1 * | 11/2002 | Choi | ............................... | 347/19 |
| 2006/0203024 A1 * | 9/2006 | Kusunoki | ......................... | 347/15 |
| 2006/0256157 A1 * | 11/2006 | Kim et al. | ....................... | 347/47 |
| 2009/0046124 A1 * | 2/2009 | Edamura et al. | ................ | 347/40 |
| 2010/0066786 A1 * | 3/2010 | Yafe | ............................... | 347/40 |
| 2010/0214340 A1 * | 8/2010 | Sugahara et al. | ............... | 347/14 |

* cited by examiner

*Primary Examiner* — Manish S Shah
*Assistant Examiner* — Roger W Pisha, II
(74) *Attorney, Agent, or Firm* — Oren Reches (57) ABSTRACT

A system and a method for printing a desired pattern on a substrate, the method may include: receiving or generating printing instructions for printing multiple patterns during multiple printing iterations, wherein at least two different printing iterations are expected to be executed by different sets of nozzles of an array of nozzles, wherein a superposition of the multiple patterns is expected to differ from the desired pattern by a tolerable difference even when a nozzle of the array of nozzles malfunctions; and printing the multiple patterns during multiple printing iterations, wherein at least two different printing iterations are expected to be executed by different sets of nozzles of the array of nozzles.

25 Claims, 5 Drawing Sheets

Receiving or generating printing instructions for printing multiple patterns during multiple printing iterations, wherein at least two different printing iterations are expected to be executed by different sets of nozzles of an array of nozzles, wherein a superposition of the multiple patterns may be expected to differ from the desired pattern by a tolerable difference even when a nozzle of the array of nozzles malfunctions. 410

Receiving or generating printing parameters to be applied during the multiple printing iterations. 412

Printing the multiple patterns during multiple during multiple printing iterations, wherein at least two different printing iterations are expected to be executed by different sets of nozzles of the array of nozzles. 420

Freezing ink printed during at least one printing iteration before continuing to perform another printing iteration. 421

Printing a first pattern of the multiple patterns by a first set of nozzles while maintaining a first angular relationship between the first set of nozzles and the first pattern and printing a second pattern of the multiple patterns by a second set of nozzles while maintaining a second angular relationship between the second set of nozzles and the second pattern, wherein the first angular relationship differs from the second angular relationship. 422

At least partially curing ink printed during each printing iteration before performing another printing iteration. 423

Performing the multiple printing iterations without inspecting the substrate during the multiple printing iterations. 424

Generating an evaluation of an outcome of a printing iteration and altering at least one printing parameter of another printing iteration in response to the evaluation. 425

Inspecting the substrate only after one or some of the multiple printing iterations. 426

Inspecting the substrate after each printing iteration. 427

MULTIPLE ITERATION SUBSTRATE PRINTING

RELATED APPLICATIONS

This application claims priority from U.S. provisional patent Ser. No. 61/425,779 filing date Dec. 22, 2010.

BACKGROUND

Mask ink is printed by using an array of ink jet nozzles (hereinafter—nozzles).

The array can include nozzles that may malfunction. A malfunctioning nozzle that does not print at all is referred to as a missing nozzle.

In most application the jetted ink is allowed to spread so that it fills the gaps or voids resulting from a missing nozzle. Thus, the ink spreads enough on the substrate to overcome missing nozzles.

Examples of such usages are:
a. When using a viscose ink such as a solder mask ink a missing nozzle can be noticed on the printed object.
b. Printing 3D model, when there is a missing nozzle instead of printing one object there will be two objects
c. Printing conductive lines, when there is a missing nozzle there will be a cut in the line and the panel will be defected.

There is a growing need to provide efficient substrate printing methods. Other applications where ink-jet may be used for manufacturing may also suffer from missing nozzles. Some examples of such occurrences:
a) Electronic circuit trace printing with conductive material: A missing nozzle will create an open circuit or a trace that does not have the expected conductivity characteristics
b) Etch resist printing: The areas to be protected by the jetted material do not get the required protection and are etched away
c) Objects that are created using ink-jet methods may result in disconnected parts due to the missing nozzles

SUMMARY

A method may be provided for printing a desired pattern on a substrate, the method may include receiving or generating printing instructions for printing multiple patterns during multiple printing iterations, wherein at least two different printing iterations are expected to be executed by different sets of nozzles of an array of nozzles, wherein a superposition of the multiple patterns may be expected to differ from the desired pattern by a tolerable difference even when a nozzle of the array of nozzles malfunctions; and printing the multiple patterns during multiple printing iterations, wherein at least two different printing iterations are expected to be executed by different sets of nozzles of the array of nozzles.

The method may include receiving information about the desired pattern to be printed on the substrate and converting the desired pattern to the multiple patterns.

The method may include freezing ink printed during at least one printing iteration before continuing to perform another printing iteration.

The method may include printing a first pattern of the multiple patterns by a first set of nozzles while maintaining a first angular relationship between the first set of nozzles and the first pattern and printing a second pattern of the multiple patterns by a second set of nozzles while maintaining a second angular relationship between the second set of nozzles and the second pattern, wherein the first angular relationship differs from the second angular relationship.

The method may include at least partially curing ink printed during each printing iteration before performing another printing iteration.

The method may include performing the multiple printing iterations without inspecting the substrate during the multiple printing iterations.

The method may include generating an evaluation of an outcome of a printing iteration; and altering at least one printing parameter of another printing iteration in response to the evaluation.

The method may include changing a viscosity of the ink in response to the evaluation.

The method may include changing a timing of a curing process of the ink in response to the evaluation.

The method may include at least partially curing ink printed during each printing iteration before performing another printing iteration.

The method wherein the ink may be selected from solder mask ink, legend ink or etch resist coating.

A system for printing a desired pattern on a substrate may be provided, the system may include: a printing controller arranged to receive or generate printing instructions for printing multiple patterns during multiple printing iterations, wherein at least two different printing iterations are expected to be executed by different sets of nozzles of an array of nozzles, wherein a superposition of the multiple patterns may be expected to differ from the desired pattern by a tolerable difference even when a nozzle of the array of nozzles malfunctions; and a printing unit that comprises an array of nozzles, arranged to print the multiple patterns during multiple during multiple printing iterations, wherein at least two different printing iterations are expected to be executed by different sets of nozzles of the array of nozzles.

The printing controller may be arranged to receive information about the desired pattern to be printed on the substrate and converting the desired pattern to the multiple patterns.

The system may include a freeze unit arranged to freeze ink printed during at least one printing iteration before an execution of another printing iteration.

The printing unit may be arranged to print a first pattern of the multiple patterns by a first set of nozzles while maintaining a first angular relationship between the first set of nozzles and the first pattern and print a second pattern of the multiple patterns by a second set of nozzles while maintaining a second angular relationship between the second set of nozzles and the second pattern, wherein the first angular relationship may differ from the second angular relationship but may be equal to the first angular relationship.

The system may include a curing unit arranged to at least partially cure ink printed during each printing iteration before performing another printing iteration.

The printing unit may be arranged to perform the multiple printing iterations without inspecting the substrate during the multiple printing iterations.

The system may include an evaluation unit arranged to generate an evaluation of an outcome of a printing iteration; and wherein the printing controller may be arranged to alter at least one printing parameter of another printing iteration in response to the evaluation.

The printing controller may be arranged to change a viscosity of the ink in response to the evaluation.

The printing controller may be arranged to change a timing of a curing process of the ink in response to the evaluation.

The system may include a curing unit arranged to at least partially curing ink printed during each printing iteration before performing another printing iteration.

The ink may be selected from solder mask ink, legend ink and etch resist coating.

A computer readable medium that is non-transitory may be provided and may store instructions for receiving or generating printing instructions for printing multiple patterns during multiple printing iterations, wherein at least two different printing iterations are expected to be executed by different sets of nozzles of an array of nozzles, wherein a superposition of the multiple patterns may be expected to differ from a desired pattern by a tolerable difference even when a nozzle of the array of nozzles malfunctions; and printing the multiple patterns during multiple printing iterations, wherein at least two different printing iterations are expected to be executed by different sets of nozzles of the array of nozzles.

The computer readable medium may store instructions for receiving information about the desired pattern to be printed on the substrate and converting the desired pattern to the multiple patterns.

The computer readable medium may store instructions for freezing ink printed during at least one printing iteration before continuing to perform another printing iteration.

The computer readable medium may store instructions for printing a first pattern of the multiple patterns by a first set of nozzles while maintaining a first angular relationship between the first set of nozzles and the first pattern and printing a second pattern of the multiple patterns by a second set of nozzles while maintaining a second angular relationship between the second set of nozzles and the second pattern, wherein the first angular relationship differs from the second angular relationship.

The computer readable medium may store instructions for at least partially curing ink printed during each printing iteration before performing another printing iteration.

The computer readable medium may store instructions for performing the multiple printing iterations without inspecting the substrate during the multiple printing iterations.

The computer readable medium may store instructions for generating an evaluation of an outcome of a printing iteration; and altering at least one printing parameter of another printing iteration in response to the evaluation.

The computer readable medium may store instructions for changing a viscosity of the ink in response to the evaluation.

The computer readable medium may store instructions for chancing a timing of a curing process of the ink in response to the evaluation.

The computer readable medium may store instructions for at least partially curing ink printed during each printing iteration before performing another printing iteration.

The ink may be selected from solder mask ink, legend ink and etch resist coating.

BRIEF DESCRIPTION OF THE DRAWINGS

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Various references are made to solder mask. It is noted that this is an example and that printing of other masks or printing a substrate can be applied.

Figure 1:
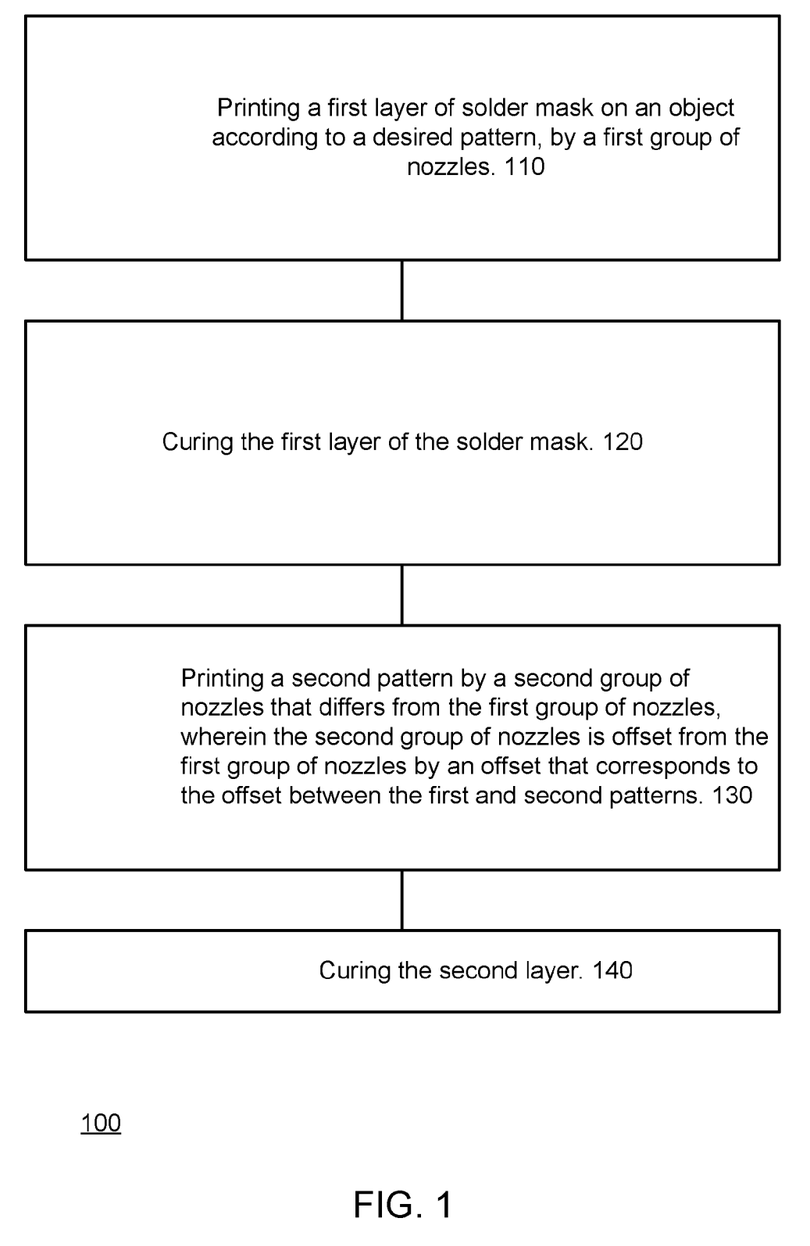
FIG. 1 illustrates the various stages of solder mask printing, according to an embodiment of the invention.

According to various embodiments a method is provided. The method includes, as illustrated in FIG. 1, one or more repetitions of:

a. Printing (110) a pattern of mask ink on an object, by a first group of nozzles. This stage can be preceded by a stage of defining the desired first pattern according to computer aided design (CAD) information.

b. Optionally Curing (120) the first pattern.

c. Printing (130) a second pattern of mask ink by a second group of nozzles that differs from the first group of nozzles, wherein the second group of nozzles is offset from the first group of nozzles by an offset that corresponds to the offset between the first and second patterns; the second pattern is printed on the first pattern; and d. Optionally Curing (140) the second pattern.

Stages 120-140 can be repeated for producing more than two layers.

The offset can be one pixel, a fraction of a pixel, more than a single pixel or any value regardless of the dimensions of a pixel.

Assuming that the offset equals K pixels, the first pattern is offset by K pixels (where K can be any arbitrary number and does not have to be an integer) in relation to the second pattern. The first group of nozzles can be expected to print pixels that are offset by K pixels in relation to the second group of pixels. If, for example, adjacent nozzles are offset by one pixel, then the first group of nozzles is offset by K nozzles from the second group of nozzles.

The repetition can be executed with optionally verifying or imaging the layers, where images are provided to a controller that may evaluate the effectiveness of this multiple layer printing scheme of the solder mask.

Figure 2A:
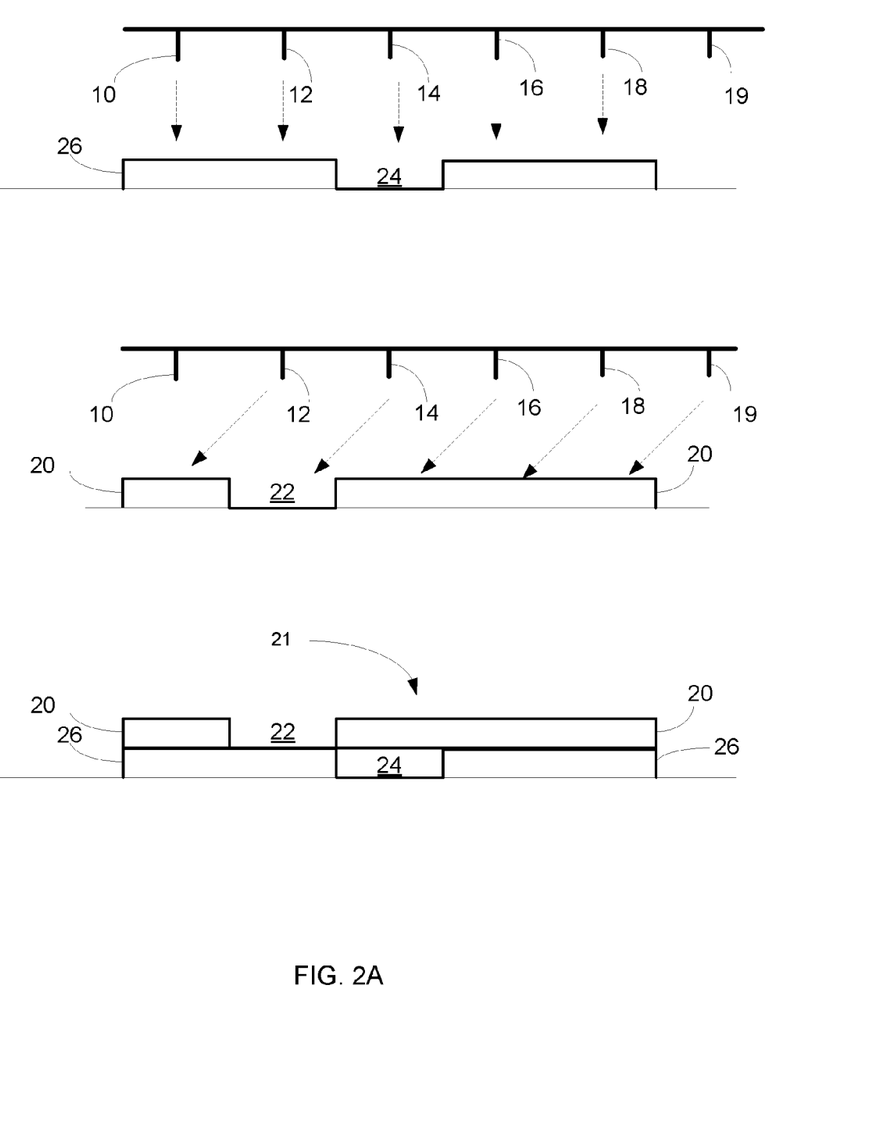
FIG. 2A illustrates two printing iterations according to an embodiment of the invention.
Figure 2B:
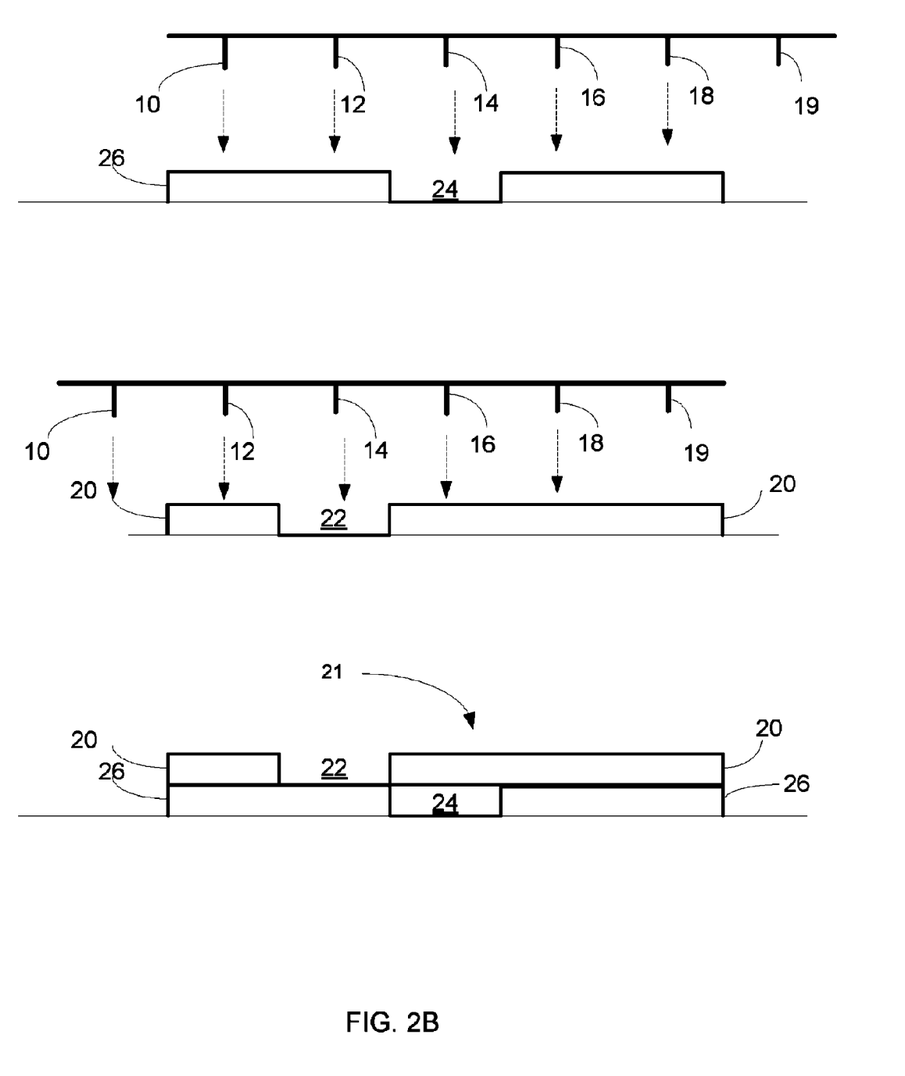
FIG. 2B illustrates two printing iterations according to an embodiment of the invention.

FIGS. 2A and 2B illustrate various printing iterations according to various embodiments of the invention. Each figure illustrates an example of a set of nozzles 10, 12, 14, 16, 18 and 19 that include a malfunctioning nozzle 14.

During the first iteration a first group of nozzles 10, 12, 14, 16 and 18 are instructed to print a line that may be represented by a "11111" printing command—indicating that all these nozzles are expected to print pixels in vertical manner—so that the area below these nozzles is covered with mask ink.

During the second iteration a second group of nozzles 12, 14, 16, 18 and 19 are instructed to print a line that may be represented by a "11111" printing command indicating that all these nozzles are expected to print pixels.

During the second iteration a second group of nozzles 12-19 are instructed to print a line that may be represented by a "11111" printing command indicating that all these nozzles are expected to print pixels.

FIG. 2A illustrates these nozzles as being instructed to print this line in an offset manner—to direct the ink in a certain orientation of one pixel to the left.

Because nozzle 14 malfunctions this second pattern includes two printed sub-areas denoted 20 that are separated by void 22. Void 22 is offset one pixel in relation to void 24. Thus, the entire area below nozzles 10, 12, 14, 16 and 18 is covered with at least one layer of mask ink—as illustrated by printed layer 21.

FIG. 2A illustrates a case in which the printing a first pattern of the multiple patterns (upper part of FIG. 2A) by a first set of nozzles is done while maintaining a first angular relationship between the first set of nozzles and the first pattern and printing a second pattern of the multiple patterns (middle part of FIG. 2A) is done by a second set of nozzles while maintaining a second angular relationship between the second set of nozzles and the second pattern, wherein the first angular relationship differs from the second angular relationship.

FIG. 2B represents a case in which the first angular relationship equals the second angular relationship (for example—vertical printing angle). The first and second sets of nozzles differ from each other by introduction of a relative displacement between the object and the nozzles (for example—a shift to the left).

The method can be implemented by a system that includes multiple nozzles, and a controller that may command the nozzles to print pattern according to the mentioned above method.

Figure 3:
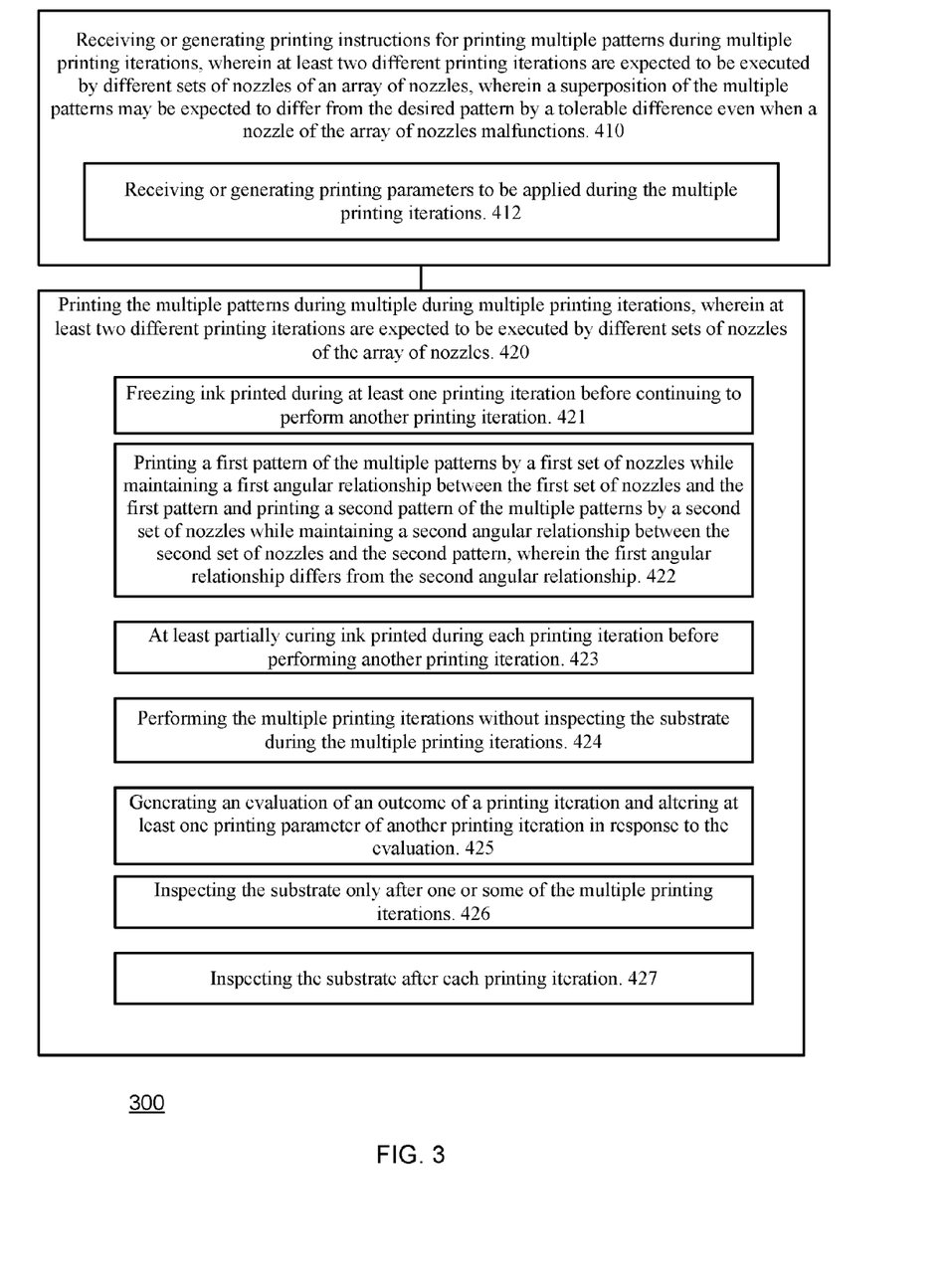
FIG. 3 illustrates a method according to an embodiment of the invention.

FIG. 3 illustrates method 300 according to an embodiment of the invention.

Method 300 may start by stage 410 of receiving or generating printing instructions for printing multiple patterns during multiple printing iterations, wherein at least two different printing iterations are expected to be executed by different sets of nozzles of an array of nozzles, wherein a superposition of the multiple patterns may be expected to differ from the desired pattern by a tolerable difference even when a nozzle of the array of nozzles malfunctions. The tolerable difference may, for example, be a tolerable thickness difference between the desired pattern and the superposition of the multiple patterns that can result from a malfunction of one or more nozzles. For example, if a certain location of the object should have been covered (according to the desired pattern) with ink of a certain thickness H1 but due nozzle malfunction it is covered by ink of a certain thickness of H2, but H2 is good enough from the point of view of the user (for example—that location is still covered with some amount of ink, the ink provides a protective layer that is thick enough—can withstand other manufacturing processes, can comply with a minimal required thickness). Referring to the example of FIGS. 2A and 2B—even at the presence of void 22 the entire area that should have been printed is covered with ink—and this is tolerable.

Stage 410 may also include receiving or generating printing parameters to be applied during the multiple printing iterations. This is illustrated by stage 412.

Stage 410 may include receiving information about the desired pattern to be printed on the substrate and converting the desired pattern to the multiple patterns. This may include receiving information about a desired pattern and converting it to multiple patterns, each being thinner than the desired pattern and to be printed by sets of nozzles that differ from each other. The different patterns can be of the same shape and size (except thickness) as the desired pattern but can differ by shape and/or size from the desired pattern. The converting may be responsive to a redundancy scheme that allocated different sets of nozzles for printing the different patterns and to the field of view of these different sets of nozzles.

Stage 410 is followed by stage 420 of printing the multiple patterns during multiple during multiple printing iterations, wherein at least two different printing iterations are expected to be executed by different sets of nozzles of the array of nozzles. Referring to the example set forth in FIGS. 2A and 2B, the different sets of nozzles are separated from each other by an offset of few pixels.

Stage 420 may include applying various printing parameters during the multiple iterations such as to control the affect of each printing iteration. For example, the amount of ink can differ from printing iteration to another, the viscosity of the ink can differ from one printing iteration to another, the timing of the curing process (delay from the end of the printing iteration) can differ from one printing iteration to another and the like. The freezing stops the propagation of the ink while a delay of the curing process may allow the ink to further expand. The printing parameters can be set in advance and remain unchanged but can be changed in view of the outcome of the printing iterations—the outcome can be examined each one or more printing iteration and in a case of missing ink that ink may be allowed to propagate to at least partially compensate for the missing ink.

Stage 420 may include stage 421 of freezing ink printed during at least one printing iteration before continuing to perform another printing iteration.

Stage 420 may include stage 422 of printing a first pattern of the multiple patterns by a first set of nozzles while maintaining a first angular relationship between the first set of nozzles and the first pattern and printing a second pattern of the multiple patterns by a second set of nozzles while maintaining a second angular relationship between the second set of nozzles and the second pattern, wherein the first angular relationship differs from the second angular relationship.

Stage 420 may include stage 423 of at least partially curing ink printed during each printing iteration before performing another printing iteration.

Stage 420 may include stage 424 of performing the multiple printing iterations without inspecting the substrate during the multiple printing iterations. Stage 424 may include inspecting the substrate only after one or some of the multiple printing iterations.

Stage 420 may include stage 425 of generating an evaluation of an outcome of a printing iteration and altering at least one printing parameter of another printing iteration in response to the evaluation. This may include, for example, changing a viscosity of the ink in response to the evaluation or changing a timing of a curing process of the ink in response to the evaluation.

The ink may be selected from solder mask ink, legend ink and etch resist coating. Stage 420 may include stage 426 of inspecting the substrate only after one or more of the multiple printing iterations. Stage 420 may include stage 427 of inspecting the substrate after each printing iteration.

Figure 4:
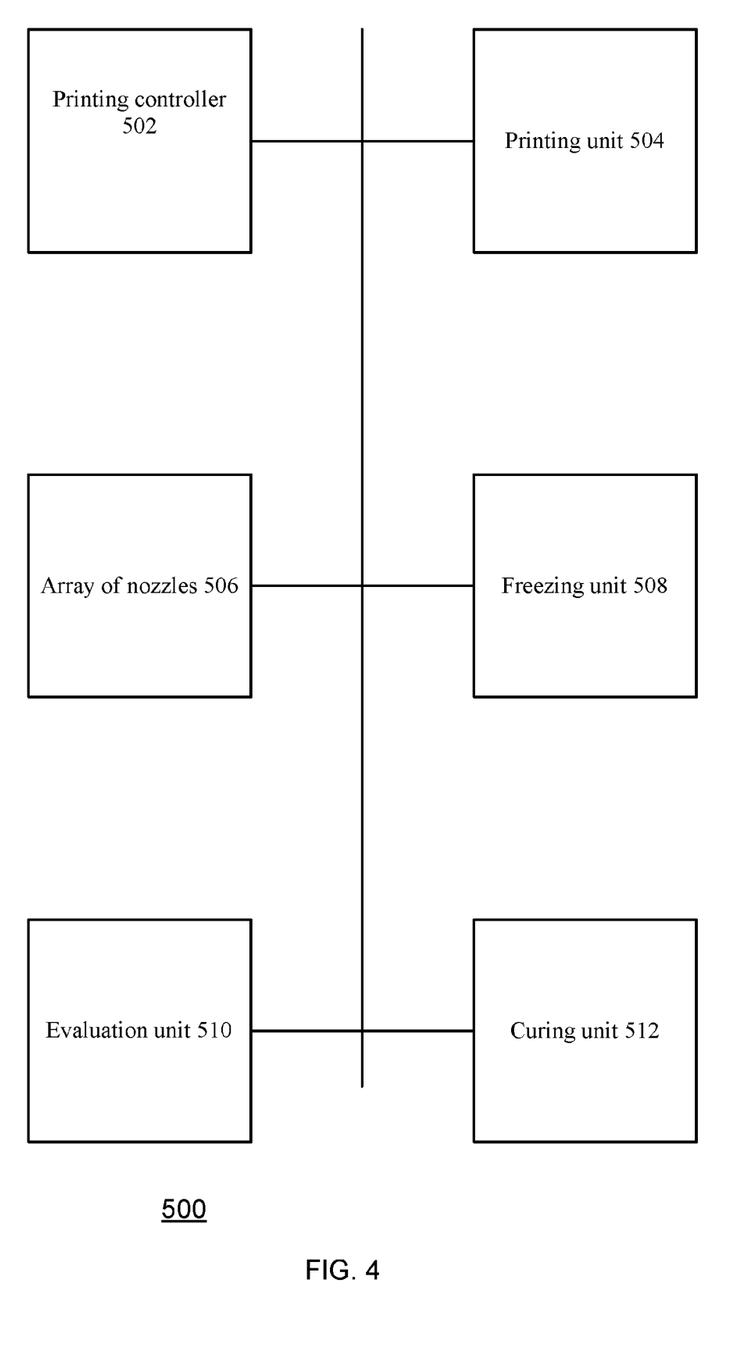
FIG. 4 illustrates a system according to an embodiment of the invention.

FIG. 4 illustrates system 500 for printing a desired pattern on a substrate, according to an embodiment of the invention.

System 500 may include:

d. A printing controller 502 that may be arranged to receive or generate printing instructions for printing multiple patterns during multiple printing iterations, wherein at least two different printing iterations are expected to be executed by different sets of nozzles of an array of nozzles, wherein a superposition of the multiple patterns may be expected to differ from the desired pattern by a tolerable difference even when a nozzle of the array of nozzles malfunctions.

e. A printing unit 504 that includes an array of nozzles 506, arranged to print the multiple patterns during multiple printing iterations, wherein at least two different printing iterations are expected to be executed by different sets of nozzles of the array of nozzles.

The printing controller 502 may be arranged to receive information about the desired pattern to be printed on the substrate and converting the desired pattern to the multiple patterns.

The system 500 may include a freezing unit 508 arranged to freeze ink printed during at least one printing iteration before an execution of another printing iteration.

The printing unit 504 may be arranged to print a first pattern of the multiple patterns by a first set of nozzles while maintaining a first angular relationship between the first set of nozzles and the first pattern and print a second pattern of the multiple patterns by a second set of nozzles while maintaining a second angular relationship between the second set of nozzles and the second pattern, wherein the first angular relationship differs from the second angular relationship.

The system 500 may include a curing unit 512 arranged to at least partially cure ink printed during each printing iteration before performing another printing iteration.

The printing unit 504 may be arranged to perform the multiple printing iterations without inspecting the substrate during the multiple printing iterations.

The system 500 may include an evaluation unit 510 arranged to generate an evaluation of an outcome of a printing iteration; and wherein the printing controller 502 may be arranged to alter at least one printing parameter of another printing iteration in response to the evaluation. The evaluation unit can include a camera and may obtain images of the substrate.

The printing controller 502 may be arranged to change a viscosity of the ink in response to the evaluation.

The printing controller 502 may be arranged to change a timing of a curing process of the ink in response to the evaluation.

The system 500 may include a curing unit 512 arranged to at least partially curing ink printed during each printing iteration before performing another printing iteration.

The ink may be selected from solder mask ink, legend ink and etch resist coating.

The printing unit 504 can include the printing controller 502 but this is not necessarily so and these units can be located at different locations.

Any of the stages of any method can be executed by a computer that executed instructions stored in a computer readable medium that is non-transitory. The computer readable medium may store instructions for receiving or generating printing instructions for printing multiple patterns during multiple printing iterations, wherein at least two different printing iterations are expected to be executed by different sets of nozzles of an array of nozzles, wherein a superposition of the multiple patterns may be expected to differ from a desired pattern by a tolerable difference even when a nozzle of the array of nozzles malfunctions; and printing the multiple patterns during multiple printing iterations, wherein at least two different printing iterations are expected to be executed by different sets of nozzles of the array of nozzles.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for printing a desired pattern on a substrate, the method comprises:
   receiving or generating printing instructions for printing multiple patterns during multiple printing iterations, wherein the multiple printing iterations comprise a first and second printing iterations; are, and
   printing the multiple patterns during multiple printing iterations; wherein the printing comprises:
   printing, during the first printing iteration, a first pattern of mask ink on an object, by a first group of nozzles;
   printing, during the second printing iteration, a second pattern of mask ink on the first pattern and by a second group of nozzles, the second group of nozzles differs from the first group of nozzles;
   wherein the second group of nozzles is offset from the first group of nozzles by an offset that corresponds to the offset between the first and second patterns;
   wherein a superposition of the multiple patterns differs from a desired pattern a tolerable difference even when a nozzle of the array of nozzles malfunctions.

2. The method according to claim 1, comprising receiving information about the desired pattern to be printed on the substrate and converting the desired pattern to the multiple patterns.

3. The method according to claim 1, comprising freezing ink printed during at least one printing iteration before continuing to perform another printing iteration.

4. The method according to claim 1, comprising printing a first pattern of the multiple patterns by a first set of nozzles while maintaining a first angular relationship between the first set of nozzles and the first pattern and printing a second pattern of the multiple patterns by a second set of nozzles while maintaining a second angular relationship between the second set of nozzles and the second pattern, wherein the first angular relationship differs from the second angular relationship.

5. The method according to claim 1, comprising at least partially curing ink printed during each printing iteration before performing another printing iteration.

6. The method according to claim 1, comprising performing the multiple printing iterations without inspecting the substrate during the multiple printing iterations.

7. The method according to claim 1, comprising generating an evaluation of an outcome of a printing iteration; and altering at least one printing parameter of another printing iteration in response to the evaluation.

8. The method according to claim 7, comprising changing a viscosity of the ink in response to the evaluation.

9. The method according to claim 7, comprising chancing changing a timing of a curing process of the ink in response to the evaluation.

10. The method according to claim 7, comprising at least partially curing ink printed during each printing iteration before performing another printing iteration.

11. The method according to claim 1, wherein the ink is selected from solder mask ink, legend ink and etch resist coating.

12. The method according to claim 1 wherein the first group of nozzles comprises is a first consecutive group of nozzles that comprises nozzles that are adjacent to each other; and wherein the second group of nozzles is a second consecutive group of nozzles that comprises nozzles that are adjacent to each other.

13. A system for printing a desired pattern on a substrate, the system comprises:

a printing controller arranged to receive or generate printing instructions for printing multiple patterns during multiple printing iterations, wherein the multiple printing iterations comprise a first and second printing iterations; and a printing unit that comprises an array of nozzles, arranged to print the multiple patterns during multiple printing iterations, wherein a printing of the multiple patterns comprises printing, during the first printing iteration, a first pattern of mask ink on an object, by a first group of nozzles; printing, during the second printing iteration, a second pattern of mask ink on the first pattern and by a second group of nozzles, the second group of nozzles differs from the first group of nozzles; wherein the second group of nozzles is offset from the first group of nozzles by an offset that corresponds to the offset between the first and second patterns; wherein a superposition of the multiple patterns differs from a desired pattern a tolerable difference even when a nozzle of the array of nozzles malfunctions.

14. The system according to claim 13, wherein the printing controller is arranged to receive information about the desired pattern to be printed on the substrate and converting the desired pattern to the multiple patterns.

15. The system according to claim 13, comprising a freeze unit arranged to freeze ink printed during at least one printing iteration before an execution of another printing iteration.

16. The system according to claim 13, wherein the printing unit is arranged to print a first pattern of the multiple patterns by a first set of nozzles while maintaining a first angular relationship between the first set of nozzles and the first pattern and print a second pattern of the multiple patterns by a second set of nozzles while maintaining a second angular relationship between the second set of nozzles and the second pattern, wherein the first angular relationship differs from the second angular relationship.

17. The system according to claim 13, comprising a curing unit arranged to at least partially cure ink printed during each printing iteration before performing another printing iteration.

18. The system according to claim 13, wherein the printing unit is arranged to perform the multiple printing iterations without inspecting the substrate during the multiple printing iterations.

19. The system according to claim 13, comprising an evaluation unit arranged to generate an evaluation of an outcome of a printing iteration; and wherein the printing controller is arranged to alter at least one printing parameter of another printing iteration in response to the evaluation.

20. The system according to claim 19, wherein the printing controller is arranged to change a viscosity of the ink in response to the evaluation.

21. The system according to claim 19, wherein the printing controller is arranged to change a timing of a curing process of the ink in response to the evaluation.

22. The system according to claim 19, comprising a curing unit arranged to at least partially curing ink printed during each printing iteration before performing another printing iteration.

23. The system according to claim 13, wherein the ink is selected from solder mask ink, legend ink and etch resist coating.

24. The system according to claim 13 wherein the first group of nozzles comprises is a first consecutive group of nozzles that comprises nozzles that are adjacent to each other; and wherein the second group of nozzles is a second consecutive group of nozzles that comprises nozzles that are adjacent to each other.

25. A computer readable medium that is non-transitory that stores instructions for receiving or generating printing instructions for printing multiple patterns during multiple printing iterations, wherein the multiple printing iterations comprise a first and second printing iterations; and printing the multiple patterns during multiple printing iterations, wherein the printing comprises: printing, during the first printing iteration, a first pattern of mask ink on an object, by a first group of nozzles; and printing, during the second printing iteration, a second pattern of mask ink on the first pattern and by a second group of nozzles, the second group of nozzles differs from the first group of nozzles; wherein the second group of nozzles is offset from the first group of nozzles by an offset that corresponds to the offset between the first and second patterns; wherein a superposition of the multiple patterns differs from a desired pattern a tolerable difference even when a nozzle of the array of nozzles malfunctions.

* * * * *